(12) United States Patent
Viehland et al.

(10) Patent No.: US 7,256,532 B2
(45) Date of Patent: Aug. 14, 2007

(54) METHOD AND APPARATUS FOR HIGH VOLTAGE GAIN USING A MAGNETOSTRICTIVE-PIEZOELECTRIC COMPOSITE

(75) Inventors: Dwight Douglas Viehland, Blacksburg, VA (US); Shuxiang Dong, Blacksburg, VA (US); Jiefang Li, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 209 days.

(21) Appl. No.: 11/073,763

(22) Filed: Mar. 8, 2005

(65) Prior Publication Data

US 2005/0194863 A1 Sep. 8, 2005

Related U.S. Application Data

(60) Provisional application No. 60/550,732, filed on Mar. 8, 2004.

(51) Int. Cl.
*H01L 41/08* (2006.01)

(52) U.S. Cl. .................................... 310/358

(58) Field of Classification Search .............. 310/358, 310/328, 368, 26, 331–332, 326, 357, 359; 324/260, 244; 331/157; 333/215; *H01L 41/08*
See application file for complete search history.

(56) References Cited

U.S. PATENT DOCUMENTS

| | | | | |
|---|---|---|---|---|
| 2,626,135 A | * | 1/1953 | Serner | 261/84 |
| 3,360,773 A | * | 12/1967 | Hensley, Jr. | 367/180 |
| 6,809,516 B1 | * | 10/2004 | Li et al. | 324/260 |
| 6,984,902 B1 | * | 1/2006 | Huang et al. | 310/328 |

* cited by examiner

*Primary Examiner*—Darren Schuberg
*Assistant Examiner*—Karen Addison
(74) *Attorney, Agent, or Firm*—Whitham Curtis Christofferson & Cook, P.C.

(57) ABSTRACT

A method and apparatus attains high voltage gain by using a composite structure of an elastic section of piezoelectric layers bonded between magnetic and electric sections of magnetostrictive layers, with a harmonic magnetic field being applied along the layers at a mechanical resonance frequency of the composite structure, through coils around the laminate carrying current, such as to produce a continuity of both magnetic and electric flux lines, and achieving a high voltage output.

17 Claims, 3 Drawing Sheets

| | $g_{33}$ $\times 10^{-3}$ | $d_{33,m}$ or $d_{33,p}$ | $d_{31,m}$ or $d_{31,p}$ | $S_{11}^H$ or $S_{11}^E$ $\times 10^{-12}\ m^2/N$ | $S_{33}^H$ or $S_{33}^E$ $\times 10^{-12}\ m^2/N$ | $k_{33}$ | $k_{31}$ | $Q_m$ |
|---|---|---|---|---|---|---|---|---|
| Terfenol-D | | $1.1 \times 10^{-8}$ Wb/N | $-5.8 \times 10^{-9}$ Wb/N | 125 | 40 | 0.7 | | <10 |
| $^b$PZT-8 piezoceramic | 25.5 | 290pC/N | -125pC/N | 11.8 | 17.4 | 0.68 | 0.33 | 1400 |

Figure 4

METHOD AND APPARATUS FOR HIGH VOLTAGE GAIN USING A MAGNETOSTRICTIVE-PIEZOELECTRIC COMPOSITE

This application claims the benefit of Provisional Application No. 60/550,732 entitled New Magneto-Electric Transformer with Higher Voltage Gain filed on Mar. 8, 2004. The invention was made under partial support of grant numbers N000140210340, N000140210126, and MURI N000140110761 from the Office of Naval Research.

BACKGROUND OF THE INVENTION

1. Field of the Invention

The present invention generally relates to high voltage miniature transformers and more particularly to use of magneto-electric (ME) laminate composites in such transformers.

2. Background Description

The magneto-electric effect is a polarization response to an applied magnetic field H, or conversely a spin response to an applied electric field E. Ferro-electromagnetic materials have been studied, such as $BiFeO_3$ and $Pb(Fe_{1/2}Nb_{1/2})O_3$. However, to date no single phase material with a high inherent coupling between spin and polarization has yet to be found.

Magneto-electric behavior has also been studied as a composite effect in multi-phase systems consisting of both piezoelectric and magnetostrictive materials. Piezoelectric/magnetostrictive composites have been the topic of numerous investigations, both experimentally and analytically. Various composite connectivities of the two phases have been studied including: 3-3 (i.e., ceramic-ceramic particle composite; ceramic, rare earth iron alloys and polymer composites) and 2-2 (laminate composites). These studies have confirmed the existence of magneto-electric effects in composites. However, the magnitude of the coupling was low for both connectivities in these prior art investigations.

Analytical and experimental investigations have focused on laminate 2-2 type composites of piezoelectric/magnetostrictive bi-materials. It has been found that the bi-material laminate composites showed much strong magneto-electric (ME) effects when they were operated at resonance states [1-7]. However, there were no reports about power device applications of the resonance ME effect. Magneto-electric devices are needed in applications such as high-power sold-state devices. Such applications require high voltage gains and high output efficiencies. However, lack of good magneto-electric materials has hampered high power applications.

SUMMARY OF THE INVENTION

It is therefore an object of the present invention to provide a magneto-electric laminate operated at resonance states having strong ME coupling for power devices applications.

Another object of the invention is to provide a magneto-electric transformer having high voltage gain.

A type of laminate geometry, in which both applied magnetic H (to magnetic phase) and induced E (from piezoelectric phase) flux lines can penetrate both phases, is that where the fields are applied parallel to the principle vibration direction (longitudinal-axis) of the laminate, rather than perpendicular to it. The present invention relies upon several laminate geometries using this concept. The approach is based on energy analysis and laws of motion, and not simply on constitutive equations. The analysis was developed for a long plate type piezoelectric/magnetostrictive laminate composite, based upon the piezoelectric and piezomagnetic equations of state, in a longitudinal-mode vibration.

The invention extends this concept to a resonance type magneto-electric transformer. The effective magneto-electric coupling coefficient, voltage gain, and output efficiency at resonance frequency demonstrate the presence of extremely high magneto-electric voltage gain effects, suitable for solid-state transformer applications.

The invention provides for a magneto-electric (ME) laminate composite consisting of magnetostrictive Terfenol-D ($Tb_{1-x}Dy_xFe_{2-y}$) and piezoelectric $Pb(Zr,Ti)O_3$ (PZT) layers. This laminate composite has an extremely high voltage gain effect of ≈300 at its resonant state, offering potential for high-voltage miniature transformer applications.

An aspect of the invention is a magneto-electric transformer comprising a top section comprised of one or more magnetostrictive layers, a bottom section comprised of one or more magnetostrictive layers, and an elastic section comprised of one or more piezoelectric layers, the elastic section being sandwiched with a mechanical bond between said magnetic section and said electric section to form a composite structure of parallel layers, wherein a harmonic ac magnetic field is applied along the parallel layers of the composite at a mechanical resonance frequency of the bonded composite structure, there being a continuity of both magnetic and electric flux lines across the sections.

BRIEF DESCRIPTION OF THE DRAWINGS

The foregoing and other objects, aspects and advantages will be better understood from the following detailed description of a preferred embodiment of the invention with reference to the drawings, in which:

FIG. 4 is a Table which presents material parameters.

DETAILED DESCRIPTION OF A PREFERRED EMBODIMENT OF THE INVENTION

Figure 1A:
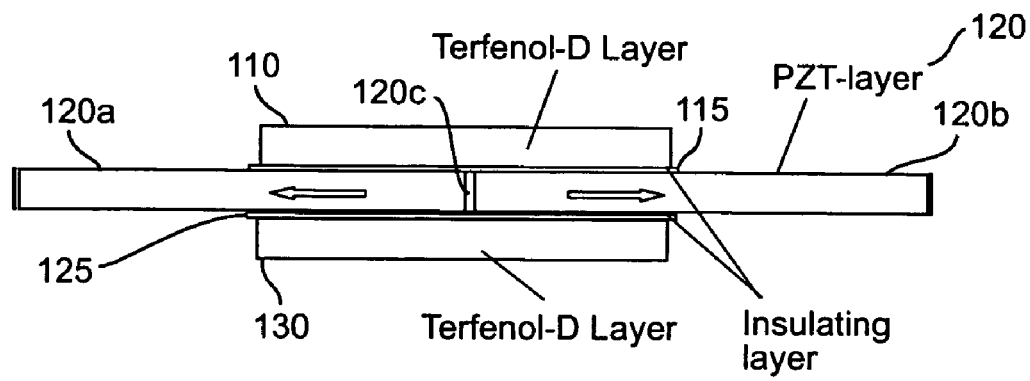
FIG. 1a is a schematic diagram showing the configuration and operation principles of a magneto-electric transformer.

Referring now to the drawings, and more particularly to FIG. 1a, there is shown the composite geometry for the best mode of implementation of the invention. It is a long plate type piezoelectric/magnetostrictive laminate composite, in which the piezoelectric layer 120 is sandwiched between two magnetostrictive layers 110 and 130, which are electrically insulated from each other by thin electric insulators 115 and 125, such as thin $Al_2O_3$ or thin glass. More complicated multilayer geometries of this general type are possible, but that given in FIG. 1a readily allows for equivalent circuit analysis. The conductive magnetostrictive layers 110 and 130 are separated by insulating thin layers 115 and 125, and thus eddy currents are effectively eliminated if the thickness of the magnetostrictive layers 110 and 130 are sufficiently thin. This magneto-electric laminate design differs from previous ones, as its aspect ratio is high, favoring the longitudinal direction along which fields are applied. The piezoelectric layer 120 consists of two elements

120a and 120b, both of which are longitudinally-poled and placed in reverse directions with respect to each other about the mid-section 120c of the laminate. This maximizes the voltage and power outputs of the device.

Figure 1B:
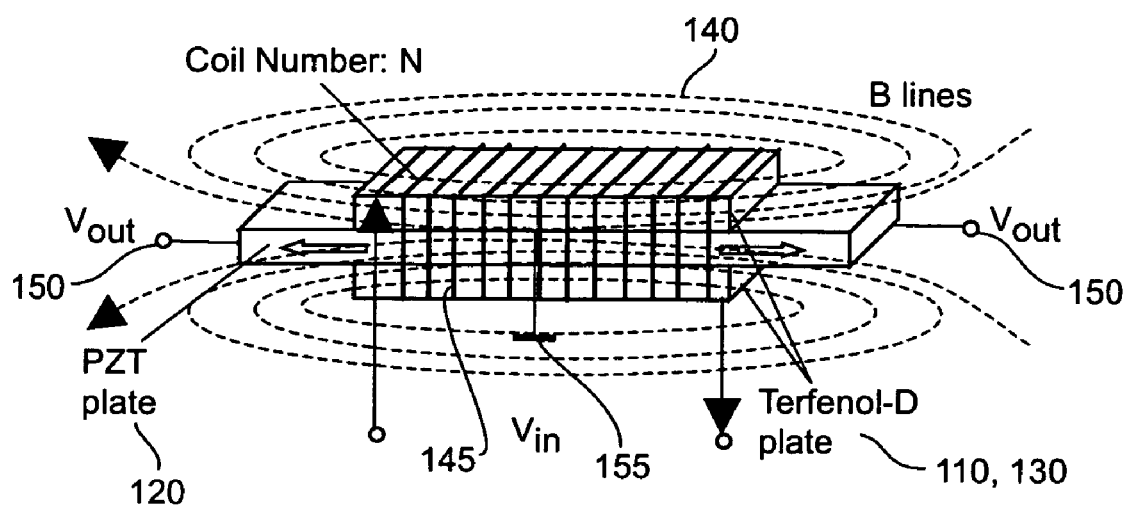
FIG. 1b is a three dimensional version of FIG. 1a showing electromagnetic field lines.

The working principle is as follows. As shown in FIG. 1b, a harmonic ac magnetic field $H_{ac}$ 140 is applied along the longitudinal direction of the composite via coil winding 145. This causes the two magnetostrictive layers 110 and 130 to shrink/expand in response to $H_{ac}$ 140. The magnetostrictive strain acts upon the piezoelectric layer 120 that is bonded between the two magnetostrictive layers 110 and 130, causing the piezoelectric layer 120 to strain, producing a voltage output between the end 150 and middle 155 electrodes. This transduction of magnetic to electrical energy is what we designate as the magneto-electric coupling effect.

A solenoid 145 with N turns around the laminate that carries a current of $I_{in}$ was used to excite an ac magnetic field $H_{ac}$, as shown in FIG. 1b. The input ac voltage applied to the coils was $V_{in}$, and its frequency was f. This excites a $H_{ac}$ of the same frequency f, along the longitudinal direction of the laminate. When the frequency of $H_{ac}$ is equal to the resonance frequency ($\omega_s=2\pi f_s$) of the laminate, the magneto-electric coupling effect is sufficiently strong that the output ME voltage ($V_{out}$) 150 induced in the piezoelectric layer 120 is much higher than $V_{in}$ 135, in particular when a suitable dc magnetic bias $H_{dc}$ is applied. Thus, under resonant drive, our ME laminate exhibits a strong voltage gain, due to the magneto-electric effect.

At the first longitudinal resonance frequency, this laminate is a half-wavelength ($\lambda/2$) ME resonator. A node line is located at the middle position of the laminate, where the vibration velocity (i.e., mechanical current) is zero. Assuming a symmetric vibration of the laminate and that the polarization of the piezoelectric layer is symmetric about the node line, the ME voltage induced across each end and middle electrodes in the layer are equivalent. The magneto-elasto-electric equivalent circuits can be derived by using the piezoelectric and piezomagnetic constitutive equations, and by applying Newton's $2^{nd}$ law of motion to the laminate and subsequently finding analogous electrical parameters.

Figure 2:
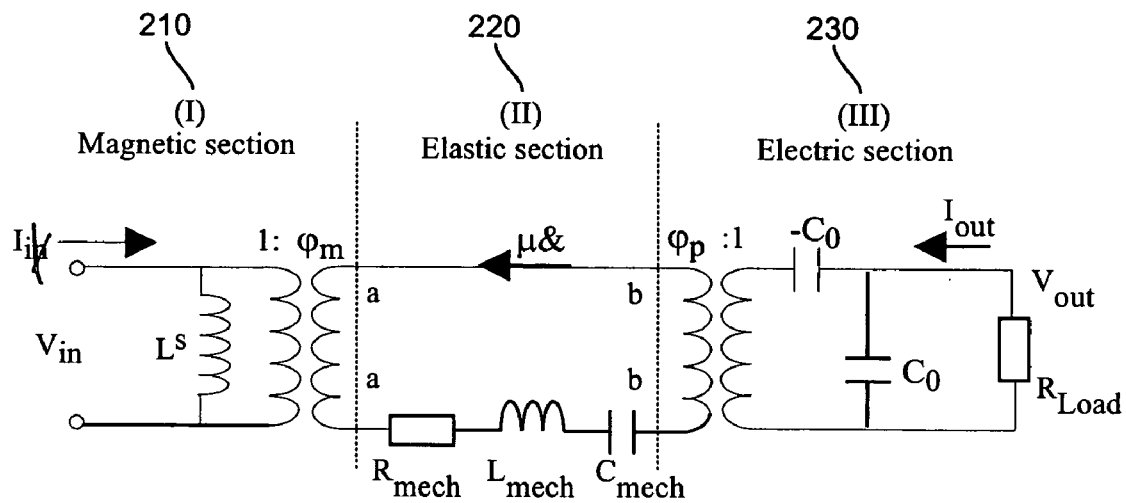
FIG. 2 is a circuit diagram showing the equivalent circuit of the magneto-electric transformer shown in FIG. 1.

The magnetoelectric voltage gain can be determined by analysis of the equivalent circuit in FIG. 2. Assuming that the circuit is unloaded and by applying Ohm's law, the maximum voltage gain can be estimated as $$V_{Gain,max} = \frac{4Q_{mech}\varphi_p^2}{\pi\omega_s C_0 Z_0} \quad (1)$$

where $Q_{mech}$ is the mechanical quality factor of the piezoelectric layer, $\phi_p$ is the elasto-electric coupling factor, $C_0$ is the clamped capacitance of piezoelectric layer, and $Z_0$ is the mechanical impedance of the laminate. From this relationship, it can be seen that the maximum voltage gain at the resonance frequency is mainly related to the piezoelectric section of the equivalent circuit in FIG. 2. The voltage gain is directly proportional to $Q_{mech}$ and $\phi_p^2$ (or $g_{33,p}^2$, piezoelectric voltage constant) in the piezoelectric layer. This is because the output voltage $V_{out}$ is generated by this section. The function of the magnetic section of the circuit is to transduce the magnetic energy into a mechanical vibration. The piezoelectric section subsequently transduces this vibration to an electrical output.

Calculations were performed using Equation (1), assuming a laminate length of 70 mm, width of 10 mm, and thickness of 6 mm. The voltage gain for a value of $Q_m=100$ was only 18.5. However, for $Q_{mech}=500$, the gain was 92.5. A typical value of $Q_{mech}$ for PZT-8 is 1400 (see Table I in FIG. 4): using this value, a maximum voltage gain of 259 can be estimated. This voltage gain is significantly larger than that of other voltage gain devices, such as electromagnetic and piezoelectric transformers. Thus, the high voltage gain of our laminate could be quite purposeful for power electronics, such as transformer applications.

We can estimate the maximum efficiency ($\eta_{max}$) of the magneto-electric transformer, using the equivalent circuit in FIG. 2. To do this, we neglect the electrical losses (mainly eddy current loss in magneto-electric material) by assuming that the laminate (i) 210 is a multi-thin-layer type; (ii) 220 is operated at relative low-frequency, and (iii) 230 has only mechanical contributions to the total loss factor. Thus, if the load of the circuit is optimum, $$R_{Load,opt} = \frac{1}{\omega_s C_0},$$

the value of $\eta_{max}$ of the laminate at resonance is $$\eta_{max} = \frac{\varphi_p^2}{\varphi_p^2 + \frac{\pi Z_0 C_0 \omega_s}{2Q_{mech}}}. \quad (2)$$

Clearly, a higher $Q_{mech}$ will result in higher efficiencies. Using the material parameters shown in Table I and by assuming that $Q_{mech}=1000$, the maximum efficiency of our ME transformer can be estimated using Equation (2) as $\eta_{max}>95\%$ when the eddy current loss in magnetostrictive material can be neglected. When eddy current losses can not be neglected, the parameters in the magnetic and elastic section will need to be complex coefficients. Correspondingly, the efficiency shall be less than $\eta_{max}$, and Equation (2) will need to be modified further.

A laminate composite consisting of a longitudinally poled piezoelectric $Pb(Zr,Ti)O_3$ (PZT) layer and two longitudinally-magnetized magnetostrictive Terfenol-D ones was fabricated as shown in FIG. 1. In our design, the Terfenol-D layers were 40 mm in length, and the piezoelectric layer was 80 mm in length. A long and thin piezoelectric layer helps to achieve higher ME voltages, as it has larger vibration amplitudes at both ends. The ME voltage gain was measured. A voltage generator was used as an input source to the coils, and an oscilloscope was used for monitoring both input and output voltages.

Figure 3:
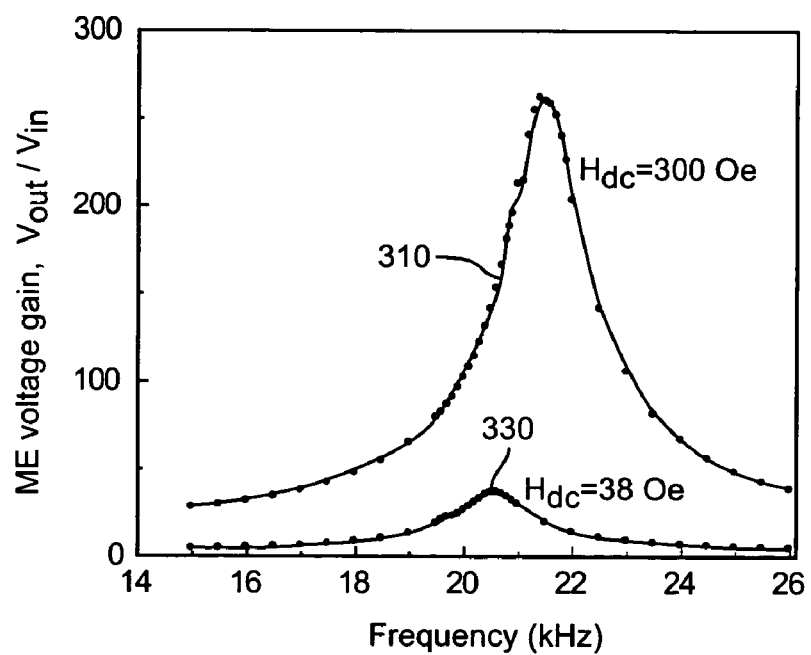
FIG. 3 is a graph of measured magneto-electric voltage gain as a function of operational frequency.

The upper graph line 310 of FIG. 3 shows the measured voltage gain $V_{out}/V_{in}$ 320 of our ME transformer as a function of the drive frequency f. A maximum voltage gain of ~260 was found at a resonance frequency of 21.3 kHz. In addition, at the resonance state, the maximum voltage gain of the ME transformer was strongly dependent on an applied dc magnetic bias $H_{dc}$, which is due to the fact that Terfenol-D has a large effective piezomagnetic coefficient only under a suitable $H_{dc}$. For $H_{dc}\approx300$ Oe, our prototype exhibited a maximum voltage gain of ≈300, which is slightly higher than the predicted value using Equation (1). This is because the piezoelectric layer is longer than the Terfenol-D layers. Because the effective operational working frequency (assuming negligible eddy currents) for a bulk Terfenol-D is less than 10 kHz, the efficiency of a magneto-electric transformer consisting of a Terfenol-D/PZT bulk laminate is much lower (<0.5$\square_{max}$) than that predicted by Equation (2). However, by using a multi-thin-layer type configuration, higher efficiencies may be obtained, as predicted by Equation (2).

It is worth noting that similar effects, albeit with a lesser voltage gain, may be obtained using other configurations. For example, the laminate geometry may be a ring-type peizoelectric/magnetostrictive composite design, in which a circumferential-poled piezoelectric ring layer (consisting, e.g., of four segments) is sandwiched between two magnetostrictive ring layers that are circumferentially magnetized. The conductive magnetostrictive layers are separated from piezoelectric layer by inserting thin insulating rings, and thus eddy currents are effectively eliminated if the thickness of the magnetostrictive layers is sufficiently thin. The voltage gain of this configuration is shown in the lower graph line 330 of FIG. 3. This design favors circumferential strains along which magnetic fields are applied circumferentially.

The working principle is as follows. A harmonic ac magnetic field $H_{ac}$, excited with a toroidal coil of N turns carrying a current of $I_{in}$ around the ring, is applied along the circumference of the ring-type laminate. This causes the two magnetostrictive ring layers to shrink/expand in their radial symmetric mode in response to $H_{ac}$. The magnetostrictive strain then acts upon the piezoelectric ring layer that is bonded between the two magnetostrictive ring layers, causing the piezoelectric ring to strain in the radial symmetric mode, producing a voltage output from each of the four segments of the ring.

Compared with conventional electromagnetic transformers, our ME transformer does not require secondary coils with a high-turns ratio in order to obtain a step-up voltage output. Compared with piezoelectric transformers, it has significantly higher voltage gains and a notably wider bandwidth. Also, it has the additional advantage of low input impedance, thus low-voltage current driving for the magnetostrictive Terfenol-D layers, and a high output impedance for the PZT one. Finally, Terfenol-D has a very high energy density of 4.9-25 kJ/m$^3$, which is notably higher than that of PZT used in conventional piezoelectric transformers. The combination of these advantages offers potential for applications in new solid-state transformer devices.

In summary, a strong magneto-electric voltage gain effect has been found in laminate composites of piezoelectric PZT and magnetostrictive Terfenol-D. We believe these results have important ramifications, potentially offering new applications in miniature solid-state power transformers.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A magneto-electric transformer, for receiving an external AC electric signal of a given voltage and outputting a stepped up output voltage in response, comprising:
    a laminated composite core formed of parallel layers, including
        a first magnetostrictive layer,
        at least one piezoelectric layer extending substantially parallel to said top magnetostrictive layer, and
        a second magnetostrictive layer extending substantially parallel to said piezoelectric layer,
    wherein said piezoelectric layer is sandwiched with a mechanical bond between said first magnetostrictive layer and said second magnetostrictive layer electric section to form the composite core of parallel layers; and
    output terminals connected to said piezoelectric layer; and
    a winding having input terminals to receive the external AC electric signal, constructed and arranged with respect to said composite core to generate an alternating magnetic field in said laminated composite core in response to said external AC electric signal flowing though said winding, said arrangement being such that an alternating magnetic flux flows through and induces a magnetostrictive strain in said first and second magnetostrictive layers, wherein said magnetostrictive strain induces a vibration in said first and second magnetostrictive layers at a mechanical frequency,
    wherein said mechanical bond is constructed and arranged such that said induced vibration of said first and second magnetostrictive layers urges a vibration of said piezoelectric layer, and
    wherein laminated composite core and said winding are constructed and arranged such that said urged vibration in said piezoelectric layer causes said output voltage across said output terminals, wherein said output voltage is stepped up with respect to said external AC electric signal.

2. The magneto-electric transformer of claim 1, wherein said first layer, said piezoelectric layer and said second layer are rings forming a layered ring structure, and said winding is a toroid wound around said ring structure.

3. The magneto-electric transformer of claim 1,
    wherein said layers are longitudinal and said composite core is a rectangular plate.

4. The magneto-electric transformer of claim 3,
    wherein said magnetostrictive layers are longitudinally-magnetized Tarfenol-D layers and said piezoelectric layers are longitudinally poled Ob(Zr,Ti)O$_{03}$.

5. The magneto-electric transformer of claim 4,
    wherein the piezoelectric layers are longer than the magnetostrictive layers.

6. The magneto-electric transformer of claim 1, further comprising means for applying a dc magnetic bias field to said ac magnetic field.

7. The magneto-electric transformer of claim 1, wherein the first magnetostrictive layer, the piezoelectric layer and the second magnetostrictive layer are constructed and arranged such that the laminated composite core has a given mechanical resonance frequency.

8. The magneto-electric transformer of claim 1, wherein he laminated composite core further comprises an electrically insulating layer located between the first magnetostrictive layer and the piezoelectric layer, and an electrically insulating layer located between the second magnetostrictive layer and the piezoelectric layer.

9. The magneto-electric transformer of claim 7, wherein the first magnetostrictive layer, the piezoelectric layer and the second magnetostrictive layer are constructed and arranged such that, in response to the external AC electric signal at the input terminals of the winding having an electrical frequency substantially equal to said mechanical resonance frequency, the voltage gain of the stepped up AC electric voltage across the output terminals with respect to the external AC electric signal has a value in approximate accordance with the following formula:

$$V_{gain} = \frac{4Q_{mech}\phi_p}{\pi\omega_s C_0 Z_0}$$

where $Q_{mech}$ is a mechanical quality factor of the piezoelectric layer, $\phi_p$ is an elasto-electric coupling factor of the laminate composite core, $C_0$ is the clamped capacitance of the piezoelectric layer, and $Z_0$ is the mechanical impedance of the laminated composite core.

10. The magneto-electric transformer of claim 7, wherein the laminated composite core further comprises an electrically insulating layer located between the first magnetostrictive layer and the piezoelectric layer and an electrically insulating layer located between the second magnetostrictive layer and the piezoelectric layer.

11. A magneto-electric transformer, for receiving an external AC electric signal of a given voltage and outputting a stepped up output voltage in response, comprising:
   a core having a magnetostrictive layer and a piezoelectric layer, sandwiched with a mechanical bond;
   output terminals connected to said piezoelectric layer; and
   a winding having input terminals to receive the external AC electric signal, constructed and arranged with respect to said core to generate an AC magnetic field in said core in response to said external AC electric signal flowing though said winding, said arrangement being such that said AC magnetic flux flows through and induces a magnetostrictive strain in said magnetostrictive layer, wherein said magnetostrictive strain induces a vibration in said magnetostrictive layer at a mechanical frequency,
   wherein said mechanical bond is constructed and arranged such that said induced vibration of said magnetostrictive layer urges a vibration of said piezoelectric layer, and
   wherein core and said winding are constructed and arranged such that said urged vibration in said piezoelectric layer causes said output voltage across said output terminals, wherein said output voltage is stepped up with respect to said external AC electric signal.

12. The magneto-electric transformer of claim 11, wherein the first magnetostrictive layer, the piezoelectric layer and the second magnetostrictive layer are constructed and arranged such that the laminated composite core has a given mechanical resonance frequency.

13. The magneto-electric transformer of claim 12, wherein the magnetostrictive layer and the piezoelectric layer are constructed and arranged such that, in response to the external AC electric signal having an electrical frequency substantially equal to the mechanical resonance frequency, the voltage gain of the stepped up AC electric voltage across said output terminals with respect to the external AC electric signal has a value in approximate accordance with the following formula:

$$V_{gain} = \frac{4Q_{mech}\phi_p}{\pi\omega_s C_0 Z_0}$$

where $Q_{mech}$ is a mechanical quality factor of the piezoelectric layer, $\phi_p$ is an elasto-electric coupling factor of the laminated composite core, $C_0$ is the clamped capacitance of the piezoelectric layer, and $Z_0$ is the mechanical impedance of said laminated composite core.

14. The magneto-electric transformer of claim 11, wherein the magnetostrictive layer and the piezoelectric layer are planar and extend in a longitudinal direction.

15. The magneto-electric transformer of claim 14, wherein the piezoelectric layer is longer in the longitudinal direction than the magnetostrictive layer.

16. The magneto-electric transformer of claim 1, wherein the piezoelectric layer includes a planar first piezoelectric section and a planar second piezoelectric section that is co-planar with the first piezoelectric section, the first piezoelectric section having a first polarization and the second piezoelectric section having a second polarization opposite the first polarization direction.

17. The magneto-electric transformer of claim 14, wherein the piezoelectric layer includes a planar first piezoelectric section and a planar second piezoelectric section that is co-planar with the first piezoelectric section, the first piezoelectric section having a first polarization and the second piezoelectric section having a second polarization opposite the first polarization direction.

* * * * *